(12) United States Patent
Heigl

(10) Patent No.: US 6,186,305 B1
(45) Date of Patent: Feb. 13, 2001

(54) DEVICE AND METHOD FOR CONVEYING ELECTRONIC COMPONENTS

(76) Inventor: Helmuth Heigl, Anemonenstr. 3a, D-83059, Kolbermoor (DE)

( * ) Notice: Under 35 U.S.C. 154(b), the term of this patent shall be extended for 0 days.

(21) Appl. No.: 09/332,075

(22) Filed: Jun. 14, 1999

(30) Foreign Application Priority Data

Jun. 19, 1998 (DE) ............................................. 198 27 459

(51) Int. Cl.⁷ .................................................. B65G 47/22
(52) U.S. Cl. ........................................................ 193/25 FT
(58) Field of Search .............................. 193/25 FT, 2 R, 193/33, 38; 198/525, 861.1

(56) References Cited

U.S. PATENT DOCUMENTS

| | | | |
|---|---|---|---|
| 3,722,062 | * | 3/1973 | Gharaibeh .............................. 29/740 |
| 3,951,772 | * | 4/1976 | Bick et al. ........................... 204/198 |
| 4,631,812 | * | 12/1986 | Young ................................... 29/741 |
| 4,660,280 | * | 4/1987 | Asai et al. ..................... 198/861.1 X |
| 4,662,954 | * | 5/1987 | Linker et al. ......................... 209/573 |
| 5,269,401 | * | 12/1993 | Ito et al. ............................ 193/25 FT |
| 5,495,661 | * | 3/1996 | Gromer et al. ......................... 29/740 |
| 5,517,748 | * | 5/1996 | Park ........................................ 29/741 |

FOREIGN PATENT DOCUMENTS

| | | | |
|---|---|---|---|
| 3539973 | | 5/1987 | (DE) . |
| 3710650 A1 | * | 10/1988 | (DE) . |
| 62-36208 | * | 2/1987 | (JP) ................................. 193/25 FT |
| 62-41105 | * | 2/1987 | (JP) ................................. 193/25 FT |
| 62-185612 | * | 8/1987 | (JP) ................................. 193/25 FT |
| 62-185613 | * | 8/1987 | (JP) ................................. 193/25 FT |

* cited by examiner

Primary Examiner—Robert P. Olszewski
Assistant Examiner—Thuy V. Tran
(74) Attorney, Agent, or Firm—Stevens, Davis, Miller & Mosher, LLP

(57) ABSTRACT

The present invention relates to a method and to a device (10; 30) for conveying electronic components (50) including a feed rail (11) in which a plurality of components (50) arranged juxtaposed in a row are located in a guideway (14). In accordance with the invention it is provided for to change the cross-section of the guideway (14) to prevent or eliminate tilting or back-ups of the components (50) accommodated in the guideway (14). For this purpose the device (10; 30) comprises a signal-controllable positioner (16). The size of the guideway (14) may be changed continually or discontinually between a minimum value and a maximum value.

16 Claims, 3 Drawing Sheets

Figure 8:
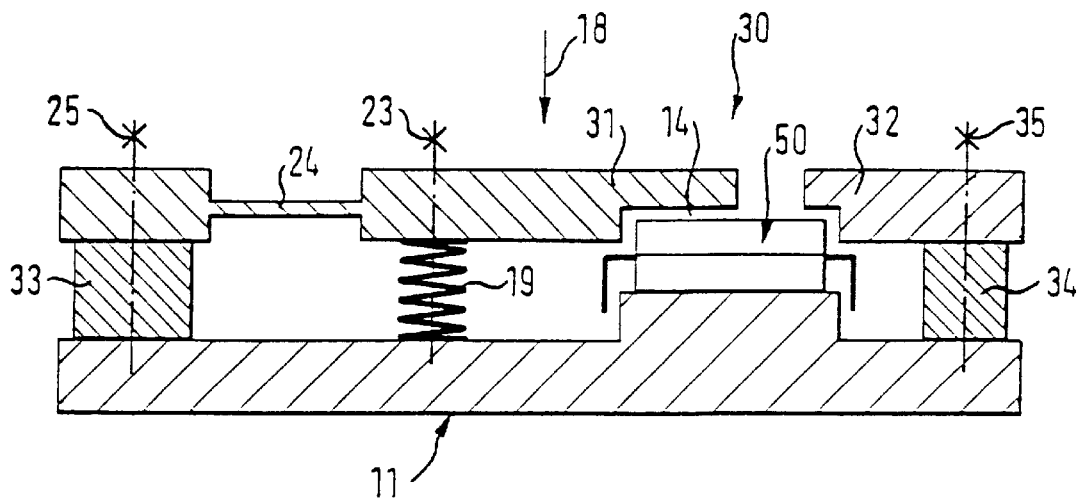

FIG. 1
FIG. 2
FIG. 3
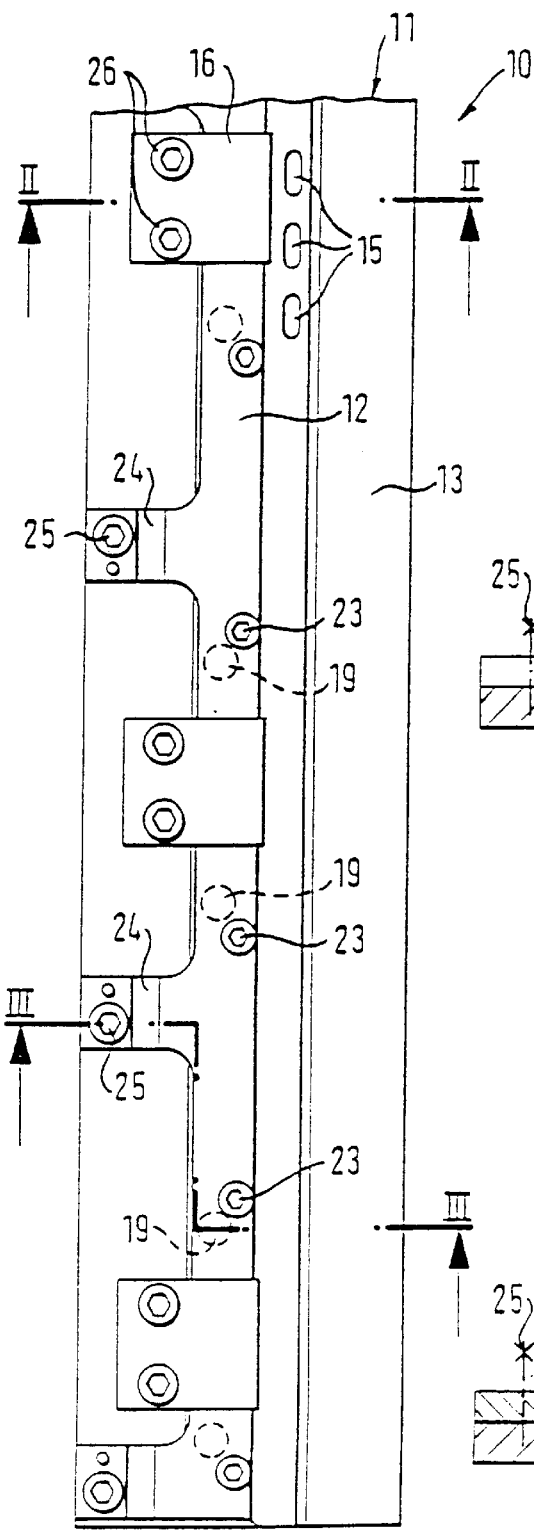
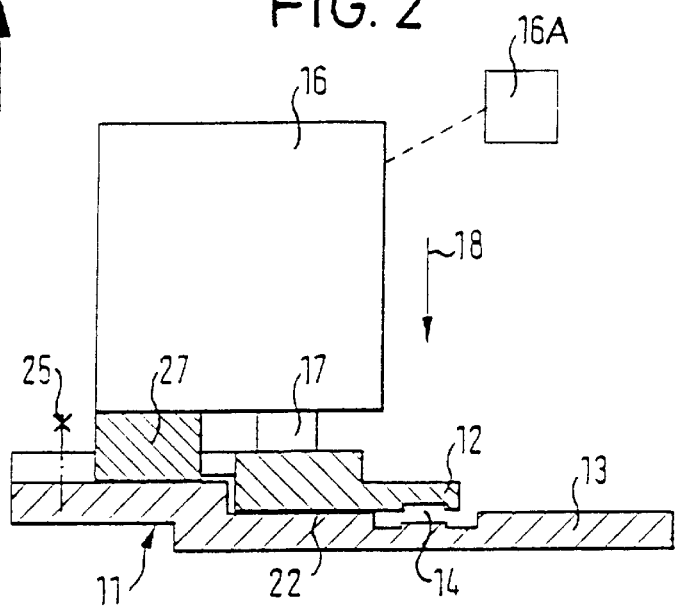
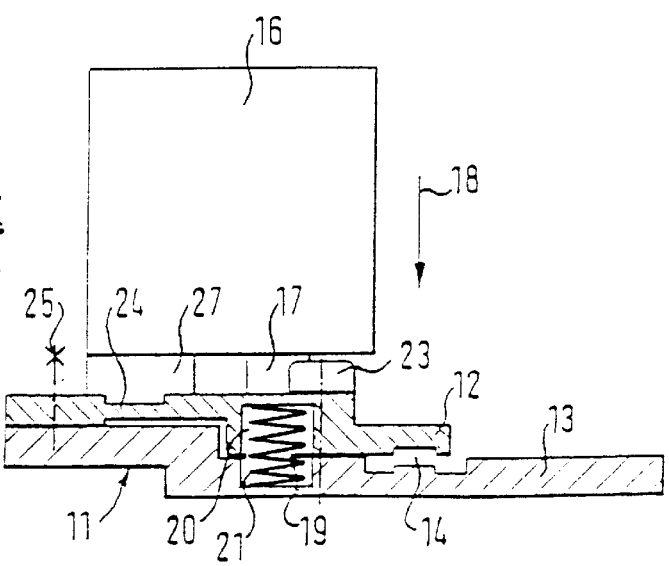

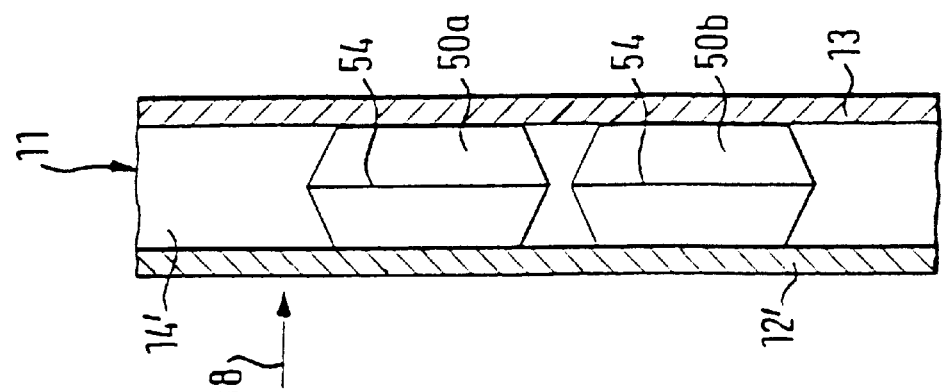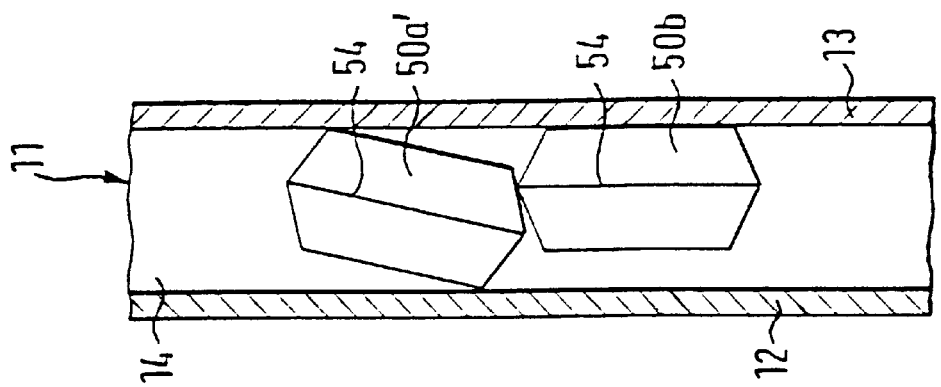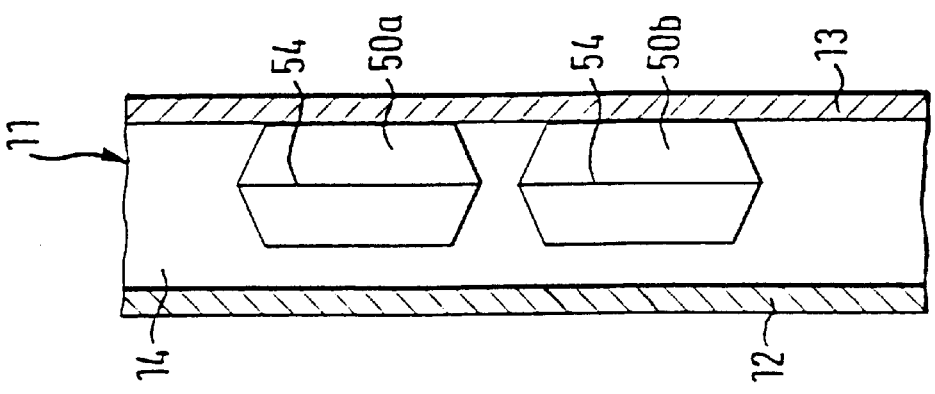

DEVICE AND METHOD FOR CONVEYING ELECTRONIC COMPONENTS

The present invention relates to a device and a method for conveying electronic components including a feed rail in which a plurality of components arranged juxtaposed in a row are located in a guideway.

In conjunction with the present invention electronic components of various kinds, more particularly integrated circuits, may find application.

One such device is known from DE 35 39 973 A1. This known device comprises a pivotable feed rail with a guideway in which a row of components to be conveyed is accommodated. In such devices it is known to prevent tilting and back-ups in the feed rail by spring-loading the components in the feed rail and urging them against one side of the guideway. This spring covers the feed rail, thus preventing visual inspection of the components accommodated in the feed rail. In addition, despite the components being spring-loading tilting or back-ups may still occur, requiring a manual remedy. In addition, the spring-loading decelerates the components which may detriment smooth conveyance.

The object of the present invention is thus to provide a device and a method permitting improved guidance and reliably preventing and eliminating tilting or back-ups.

In accordance with the invention to achieve this object in a device of the aforementioned kind it is provided for that the device comprises a signal-controllable positioner for changing the cross-section of the guideway to prevent or eliminate tilting or back-ups of the components accommodated in the guideway.

The signal-controllable positioner permits a defined change in the cross-section of the guideway whilst eliminating a permanent spring-loading which hitherto detrimented smooth conveyance of the components. Furthermore, tilting or back-ups are prevented by changing the cross-section of the guideway since the components are repeatedly aligned relative to each other. Likewise, any tilting or back-ups having already occurred may be remedied by changing the size of the guideway, i.e. there now being no need for manual intervention to remedy tilting or back-ups.

Advantageous aspects and further embodiments of the invention read from the sub-claims.

Advantageously, the feed rail comprises an upper part and lower part defining between them the guideway, the positioner being suitable to change the spacing between upper part and lower part, thus resulting in the design of the feed rail being simplified since the upper part and the lower part can now be fabricated separately from each other and subsequently connected together.

In an advantageous further embodiment the positioner is suitable for urging the upper part of the feed rail against the lower part, thus resulting in the cross-section of the guideway being changed so that the components accommodated in the guideway are aligned on the lower part of the feed rail. The lower part itself may be configured fixed and applied to a host system.

In another advantageous aspect the device comprises a return element suitable for removing the upper part of the feed rail from the lower part. The signal-controllable positioner thus reduces the cross-section of the guideway whilst the return element increases it. The signal-controllable positioner thus merely needs to permit a controlled movement in one direction whilst for the return a separate return element is used, as a result of which the design and control of the device in accordance with the invention is simplified.

Advantageously the return element is arranged between the upper part and the lower part of the feed rail and configured as a spring element. In reducing the cross-section of the guideway this spring element is compressed, automatically increasing the size of the guideway as soon as the force applied by the positioner is removed. No separate control for increasing the size of the guideway is needed.

In accordance with another advantageous aspect the upper part is pivotally connected to the lower part via at least one joint. Complicated guides as would be necessary in shifting the upper part parallel to the lower part are now no longer needed.

To advantage, the upper part comprises windows permitting a visual inspection of the electronic components accommodated in the guideway.

In an advantageous first embodiment the upper part clasps the guideway completely, thus eliminating the need for any additional retaining and guiding element.

In accordance with a second advantageous embodiment the upper part clasps the guideway partially, a guide strip fixedly connected to the lower part being provided spaced away from the upper part to close off the guideway. In this aspect the mass moved is reduced. Furthermore, the clearance needed for movement of the upper part is reduced so that several devices in accordance with the invention may be arranged directly juxtaposed.

To advantage, the positioner is configured as a pneumatic positioner. Making use of a pneumatic positioner eliminates any formation of magnetic fields or interference electrical fields which could otherwise detriment testing of the electronic components when using electrically actuated positioners.

In another advantageous aspect the device comprises a stop, more particularly an adjustable stop for defining the maximum cross-section of the guideway, as a result of which the maximum size of the guideway can be adapted to the electronic components to be conveyed in each case.

Advantageously this stop is configured as a setscrew. Such setscrews are simple to fit at low cost and easy to set precisely.

In accordance with yet another aspect the invention relates to a method for conveying electronic components, wherein a plurality of components arranged juxtaposed in a row is accommodated, this relating more particularly to a method for operating a device as described at the outset.

In accordance with the invention it is provided for in this method that the cross-section of the guideway is changed by a signal-controllable positioner to prevent or eliminate tilting or back-ups of the components accommodated in the guideway.

In a first embodiment of the method it is provided for that the cross-section of the guideway is changed continually between a minimum value and a maximum value. The size of the guideway changes continually so that tilting or back-ups in the guideway are eliminated.

In accordance with a second embodiment the cross-section of the guideway is changed discontinually between a minimum value and a maximum value, the cross-section of the guideway thus remaining unchanged over a predetermined period of time before then being changed and reassumming the original value. This abrupt change in the guideway prevents tilting or back-ups of the components. In addition, any tilting or back-ups already having occurred are remedied.

To advantage, changing the cross-section of the guideway is done in predetermined time intervals. These time intervals are established empirically and may amount to five seconds, for example. The time intervals are selected so small that tilting or back-ups cannot occur, thus preventing any standstill of the conveyance of the electronic components. As a precautionary measure the change in the cross-section of the guideway is made in the predetermined time intervals so that there is no tendency for tilting or back-ups to occur.

Figure 9:
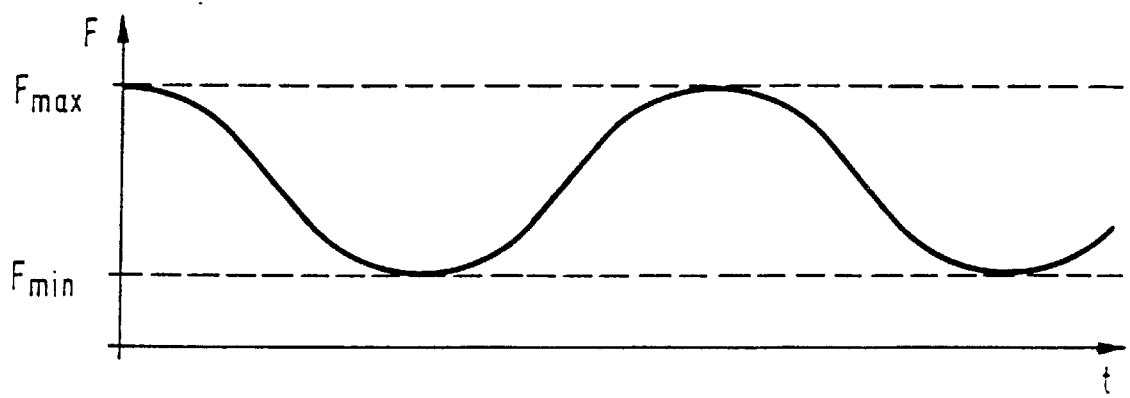
Figure 10:
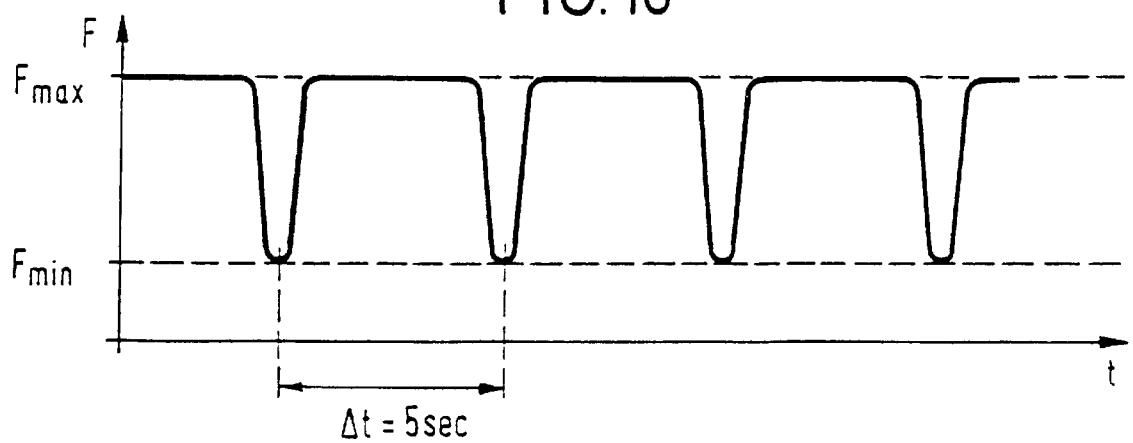

The invention will now be detained by way of example embodiments, illustrated schematically in the drawing in which:

| | |
|---|---|
| Fig. 1 | is a plan view of a first example embodiment of the invention; |
| Fig. 2 | is a section taken along the line II-II; in Figure 1 |
| Fig. 3 | is a section taken along the line III-III; in Figure 1 |
| Fig. 4 | is a perspective illustration of an electronic component; |
| Figs. 5 to 7 | illustrate the sequence in remedying a tilt or back-up situation by changing the cross-section of the guideway; |
| Fig. 8 | is a view similar to that as shown in Fig. 3 in a further embodiment; and |
| Figs. 9 and 10 | illustrate two different possibilities for changing the cross-section of the guideway. |

Referring now to FIGS. 1 to 3 there is illustrated a first embodiment of a device 10 in accordance with the invention. This device 10 comprises a feed rail 11 consisting of an upper part 12 and a lower part 13. Formed between the upper part 12 and the lower part 13 is a guideway 14. The upper part 12 comprises a series of windows 15 for visual inspection of the electronic components accommodated in the guideway 14.

A source of control signal 16A schematically shown in FIG. 2 for changing the cross-section of the guideway 14, a pneumatic cylinder 16 with a piston 17 is provided acting on the upper part 12 of the feed rail 11 in the direction of the arrow 18. Arranged between the upper part 12 and the lower part 13 is a return spring 19 engaging recesses 20, 21 in the upper part 12 and in the lower part 13 and being guided thereby. An interspace 22 between the upper part 12 and the lower part 13 permits a movement of the upper part 12 relative to the lower part 13. Provided to limit the travel in definining maximum component height is a setscrew 23 which passes through the upper part 12 and is secured in the lower part 13.

The upper part 12 comprises several joints 24 and is secured to the lower part 13 by fastener bolts 25. For securing the pneumatic cylinder 16 fastener bolts 26 are provided. The pneumatic cylinder 16 is furthermore spaced away from the lower part 13 by a shim pack 27, i.e. by changing the overall thickness of these shims 27 the impact velocity of the piston 17 can be varied.

The upper part 12 is thus pivotably mounted via the joints 24 relative to the lower part 13. Via the piston 17 the pneumatic cylinder 16 is able to exert a force on the upper part 12 in the direction of the arrow 18, the upper part 12 being accordingly pivoted in the direction of the arrow 18 so that the cross-section of the guideway 14 is diminished. For the return action the pneumatic cylinder 16 is unloaded. The return spring 19 moves the upper part 12 opposite to the direction of the arrow 18 and thereby increases the size of the guideway 14. The maximum size of the guideway 14 is set via the setscrews 23 which define the interspace 22 between the upper part 12 and the lower part 13 and thus define the cross-section of the guideway 14.

Referring now to FIG. 4 there is illustrated an electronic component 50 to be conveyed. The component 50 is configured more or less cuboidal and comprises an upper half 51 as well as a lower half 52. Accommodated between the two halves 51, 52 is a circuit board (not shown) accessible via the terminals 53. In the abutment region between the two halves 51, 52 an edge 54 is formed.

It is often the case that the two halves 51, 52 are not precisely aligned relative to each other due to lack of production accuracy. In addition to this the two halves 51, 52 are not precisely cuboidal, they instead usually comprising slightly inclined side walls, as a result of which tilting or back-ups may form in the feed rail 11.

Referring now to FIGS. 5 to 7 it is illustrated how such tilting or back-ups materialize and how this is remedied. FIG. 5 shows the normal conveying condition. Illustrated in the guideway 14 of the feed rail 11 are two components 50a, 50b moving smoothly. In FIG. 6 the component 50a has come into contact with the component 50b and has assumed a displaced position 50a', i.e. it has become tilted in the guideway 14 thus making further conveyance impossible.

To remedy the tilt or back-up the upper part 12 is brought into its position 12' in the direction of the arrow 18 towards the lower part 13. The cross-section of the guideway 14 is reduced to the dimensions 14' as shown. The upper part 12 of the guide strip 11 thus exerts a force on the tilted component 50a and urges it against the lower part 13, as a result of which the components 50a, 50b are separated from each other and the tilt and thus the back-up remedied. Subsequently the upper part 12 is moved back opposite to the direction of the arrow 18 into its starting position as shown in FIG. 5, after which smooth conveyance of the components 50a, 50b can be resumed.

Changing the cross-section of the guideway 14 is preferably implemented prior to the tilt or back-upper as shown in FIG. 6 having fully materialized. When only slight tilting of the component 50a is involved conveyance in the feed rail 11 is still smooth, although a tilt or back-up is imminent. Changing the size of the guideway 14 will also remedy such slight tilting.

Referring now to FIG. 8 there is illustrated a further example embodiment of a device 30 in accordance with the invention, whereby like or identical components are identified by like reference numerals as in FIGS. 1 to 3. As evident from FIG. 8 an upper part 31 is provided which clasps the guideway 14 only partially. Provided spaced away from the upper part 31 is a guide strip 32 which closes off the guideway 14. The component 50 is thus reliably held in the guideway 14. Securing the upper part 31 as well as the guide strip 32 is done by means of shims 33, 34 together with fastener bolts 25, 25. In this embodiment the clearance needed for the pivoting movement of the upper part 31 is less than in the embodiment as shown in FIGS. 1 to 3. More particularly, two devices 30 in accordance with the invention may be provided directly juxtaposed with a common guide strip 32.

Referring now to FIGS. 9 and 10 two possibilities of changing the cross-section of the guideway 14 are illustrated. In both cases the time t reads from the abscissa and the cross-sectional surface area F of the guideway 14 reads from the ordinate.

FIG. 9 plots a continually change in the cross-section of the guideway 14 between a minimum value $F_{min}$ and a maximum value $F_{max}$. Due to this continual change, tilting or back-ups of components 50 in the guideway 14 are preventing or remedied.

FIG. 10 plots a discontinuous change in the cross-section of the guideway 14 again between a minimum value $F_{min}$ and a maximum value $F_{max}$. Here, the cross-section of the guideway 14 is abruptly reduced from maximum value $F_{max}$ to the minimum value $F_{min}$ and subsequently re-increased, thus remedying false positioning of components 50 in the guideway 14 capable of resulting in tilting or back-ups, i.e. preventing such tilting or back-ups. In addition, any tilting or back-ups having already occurred can be remedied.

The time interval Δt between changes in the cross-section of the guideway 14 is defined such that tilting or back-ups cannot occur, i.e. are prevented. A typical time interval At amounts to approximately five seconds, although other time intervals may be selected depending on the size of the components 50, the conveying speed and other influencing factors.

The device 10, 30 in accordance with the invention and the method in accordance with the invention are suitable to eliminate malpositioning or tilting of components 50 accommodated in the feed rail 11, thus reliably preventing tilting or back-ups of the components accommodated in the guideway 14. Should such tilting or back-ups nevertheless occur, these too may be remedied in accordance with the invention.

What is claimed is:

1. A device for conveying electronic components and for preventing or eliminating tilting or back-ups of the electronic components, said device comprises:

a feed rail having an upper and a lower part;

a guideway defined by said upper and lower parts, said guideway having a cross-section for location and conveyance therein of a plurality of electronic components arranged juxtaposed in a row; and a positioner repeatedly responsive to control signals that direct changes to said cross-section for prevention or elimination of tilting or back-Lips of the electronic components located in said guideway during conveyance of the electronic components.

2. The device as set forth in claim 1, wherein the feed rail (11) comprises an upper part (12; 31) and lower part (13) defining between them the guideway (14), the positioner (16) being suitable to change the spacing between upper part (12; 31) and lower part (13).

3. The device as set forth in claim 2, wherein the positioner (16) is suitable for urging the upper part (12; 31) of the feed rail (11) against the lower part (13).

4. The device as set forth in claim 3, wherein the device comprises a return element (19) suitable for removing the upper part (12; 31) of the feed rail (11) from the lower part (13).

5. The device as set forth in claim 4, wherein the return element (19) is arranged between the upper part (12; 31) and the lower part (13) of the feed rail (11) and configured as a spring element.

6. The device as set forth in claim 2 wherein the upper part (12; 31) of the feed rail (11) is pivotally connected to the lower part (13) via at least one joint (24).

7. The device as set forth in claim 2 wherein the upper part (12; 31) of the feed rail (11) is provided with windows (15).

8. The device as set forth in claim 2 wherein the upper part (12; 31) of the feed rail (11) clasps the guideway (14) completely.

9. The device as set forth in claim 2 wherein the upper part (12; 31) of the feed rail (11) clasps the guideway (14) partially, a guide strip (32) fixedly connected to the lower part (13) being provided spaced away from the upper part (12; 31) to close off the guideway (14).

10. The device as set forth in claim 1 wherein the positioner (16) is configured as a pneumatic positioner (16).

11. The device as set forth in claim 1 wherein the device (10; 30) comprises a stop (23), more particularly an adjustable stop for defining the maximum cross-section of the guideway (14).

12. The device as set forth in claim 11, wherein the stop (23) is configured as a setscrew.

13. A method for conveying electronic components that prevents or eliminates tilting and back-ups of the conveyed components, the method comprising the steps of:

defining a guideway having a cross section between upper and lower parts of a feed rail;

arranging a plurality of electronic components juxtaposed in a row in the guideway between the upper and lower parts of the feed rail;

conveying the arranged electronic components in the guideway; and during conveyance of the electronic components, repeatedly changing the cross-section with a positioner responsive to control signals to prevent or eliminate tilting or back-ups of the electronic components.

14. The method as set forth in claim 13, wherein the step of changing further comprises:

continually changing the cross-section of the guideway (14) between a minimum value and a maximum value.

15. The method as set forth in claim 13, wherein the step of changing further comprises:

discontinually changing the cross-section of the guideway (14) between a minimum value and a maximum value.

16. The method as set forth in claim 15, wherein the changing step is done in predetermined time intervals.

* * * * *